(12) United States Patent
Magera et al.

(10) Patent No.: US 7,064,477 B2
(45) Date of Patent: Jun. 20, 2006

(54) LOW POWER SCHOTTKY EMITTER

(75) Inventors: Gerald G. Magera, Hillsboro, OR (US); Gregory A. Schwind, Hillsboro, OR (US); James B. McGinn, Hillsboro, OR (US); David S. Jun, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 10/909,621

(22) Filed: Aug. 2, 2004

(65) Prior Publication Data

US 2005/0001220 A1    Jan. 6, 2005

Related U.S. Application Data

(62) Division of application No. 09/981,663, filed on Oct. 16, 2001, now Pat. No. 6,771,013.

(60) Provisional application No. 60/241,444, filed on Oct. 17, 2000.

(51) Int. Cl.
*H01J 9/02* (2006.01)
*H01J 1/88* (2006.01)

(52) U.S. Cl. .................. 313/336; 313/275; 313/271; 445/50; 445/46

(58) Field of Classification Search ........ 313/271–273, 313/275, 276–279, 336, 351, 309, 346 R; 445/46, 50
See application file for complete search history.

(56) References Cited

U.S. PATENT DOCUMENTS

| | | | |
|---|---|---|---|
| 1,954,420 | A | 4/1934 | Marvin et al. |
| 3,814,975 | A | 6/1974 | Wolfe et al. |
| 3,869,636 | A | 3/1975 | Lawrence |
| 4,739,219 | A | 4/1988 | Hume |
| 5,057,736 | A | 10/1991 | Noda et al. |
| 5,449,968 | A | 9/1995 | Terui et al. |
| 5,616,926 | A | 4/1997 | Shinada et al. |
| 5,763,880 | A | 6/1998 | Nisiyama et al. |
| 5,838,096 | A | 11/1998 | Shinada et al. |
| 5,892,224 | A | 4/1999 | Nakasuij |
| 6,342,763 | B1 | 1/2002 | Fukushima et al. |
| 6,771,013 | B1 | 8/2004 | Magera et al. |

FOREIGN PATENT DOCUMENTS

EP          0755064 A     1/1997

*Primary Examiner*—Karabi Guharay
(74) *Attorney, Agent, or Firm*—Michaell O. Scheinberg

(57) ABSTRACT

A low input power consumption, compact thermal field emitter is suitable for use in electron beam systems, particularly those systems that use an array of electron beams or a miniature electron beam system. The thermal field emitter design reduces heat loss by reducing heat transfer to the base. To achieve reduced loses the design incorporates the use of high electrical resistivity, low thermal conductivity materials for construction of the filament posts and the filaments. Such materials further reduce heat loss and reduce input current requirements. In one embodiment, the base includes counterbores that reduce the heat conduction path between the filament posts and the base, and moves the contact area further from the filament.

22 Claims, 3 Drawing Sheets

LOW POWER SCHOTTKY EMITTER

This application is a divisional of U.S. patent application Ser. No. 09/981,663, filed Oct. 16, 2001 and issued as U.S. Pat. No. 6,771,013, which claims priority from U.S. Prov. Pat. App. No. 60/241,444, filed Oct. 17, 2000, both of which are hereby incorporated by reference.

TECHNICAL FIELD OF THE INVENTION

The present invention relates to the field of thermal field emission sources and, in particular, to a compact, low input power consumption thermal field emitter.

BACKGROUND OF THE INVENTION

Electron emission cathodes, also referred to as electron emitters or electron sources, are used in devices such as scanning electron microscopes, transmission electron microscopes, semiconductor inspection systems, and electron beam lithography systems. In such systems, an electron source provides electrons, which are then guided into an intense, finely focused beam.

One type of electron source widely used in modern electron beam systems is the thermal field emission cathode, which uses a combination of heat and electric field to emit electrons. One type of thermal emission cathode is a Schottky emission cathode, commonly referred to as a Schottky emitter. (Although the term "Schottky emission" refers to a specific operating mode of an emitter, the term "Schottky emitter" is used more broadly to describe a type of electron emitter that may be capable of operating in a variety of modes, including a Schottky emission mode.) A Schottky emitter uses a very thin coating on a heated emitter tip to reduce its work function, that is, the energy required to free an electron from the emitter surface.

FIG. 1 shows part of a typical prior art Schottky emitter 12, such as the one described in U.S. Pat. No. 3,814,975 to Wolfe et al. for "Electron Emission System." Schottky emitter 12 includes a polycrystalline tungsten, hairpin-shaped filament 14 that supports and heats an emitter 16 having an apex 22 from which the electrons are emitted. Applicants herein use the term "emitter" alone to refer to that portion of the electron source from which electrons are emitted (e.g., emitter 16 of FIG. 1) and the terms "Schottky emitter" and "thermal field emitter" to refer to the entire electron source assembly (e g., Schottky emitter 12). Heating current is supplied to filament 14 through filament posts 26, typically composed of molybdenum, kovar, or tungsten and extending through both sides of a base 28. Filament posts 26 are typically inserted through close-fitting holes 30 in base 28 and secured by brazing. Schottky emitter 12 typically operates with apex 22 at a temperature of between 1,700 K and 1,900 K, most typically at around 1,800 K. A suppressor cap 32 is typically press fitted onto base 28 and extends out to near the emitter apex 22 to reduce the undesirable emission of electrons from the shank of the emitter.

Emitter 16 is typically made from a single crystal of tungsten oriented in the <100> direction and coated with a coating material, such as zirconium and oxygen, to lower the work function of the emitter tip by approximately 1.5 electron volts. At the high temperatures at which Schottky emitter 12 operates, the coating material tends to evaporate from emitter 16 and must be continually replenished to maintain the lowered work function at apex 22. A reservoir 34 of the coating material is typically provided to replenish the coating on emitter 16. The material from reservoir 34 diffuses along the surface and through the bulk of emitter 16 toward apex 22, thereby continually replenishing the coating there. The input power required to heat a Schottky emitter is substantial, typically somewhat greater than 2 watts.

As electron beam instruments become more accepted in production environments as inspection and processing tools, users demand increased throughput. One method of increasing speed entails incorporating several electron beams into a single system. In such systems, the heat conducted and radiated from multiple thermal field emitters is additive and could produce an overall system temperature that would be unacceptably high and can cause drift in the emitter position. Another trend in electron beam instruments is miniaturization. Smaller instruments cost less to construct, take up less space in a production area, and are more mobile. Smaller instruments are particularly well suited for production applications, such as electron beam lithography for forming microscopic structures in integrated circuit assembly. For example, U.S. Pat. No. 6,218,664 to Krans et al. describes an electrostatic objective lens and electrical scanning device that can be used in a very small electron beam system.

It is desirable to reduce the size and power consumption of thermal field emitters to allow construction of smaller electron beam systems and to fit more electron columns within a system requiring the use of multiple emitters. Because of the small volume and dense packing of components in such systems, it is desirable to reduce not only the size of the thermal field emitter, but also the power consumption and the heat output of the thermal field emitter or emitters. The great amount of heat produced by the multiple closely packed thermal field emitters can adversely affect the operation of the electron columns.

One method of reducing the undesirable heat conducted and radiated into the electron column from a thermal field emitter is to use a substantial quantity of a thermally conductive material attached to the base and filament posts to provide a path to conduct excess heat away from the source. Unfortunately, cooling the base or the filament posts tends to cool the emitter assembly as well, and so has the undesirable effect of increasing the input power required to maintain emitter apex 22 at an acceptable operating temperature.

SUMMARY OF THE INVENTION

An object of the invention is to provide an electron source having reduced input power consumption.

An aspect of the invention includes providing an electron source having reduced thermal losses.

Yet another aspect of the invention includes providing a compact electron source.

Still another aspect of the invention includes providing a thermal field electron source having reduced input power consumption and reduced thermal losses.

Yet a further aspect of the invention includes providing an electron beam system that uses multiple low power electron sources.

Still a further aspect of the invention includes providing a compact electron beam instrument that uses a low power electron source.

The present invention comprises a thermal field emitter that is compact and that consumes less input power than a typical prior art emitter for a comparable emitter operating temperature. The invention maintains the emitter tip at the optimum operating temperature while reducing heat losses in the thermal field emitter, particularly heat losses through the base. The inventive emitter has a base that has a sufficient external area for attaching a suppressor cap and for attaching the complete thermal emitter assembly to its holder, yet it has a reduced thermal path between the filament posts and the base, thereby reducing heat transfer. Because heat transfer to the base is reduced, less power is required to maintain the emitter tip at operating temperature, so less electrical current is required to heat the filament. The filament and filament posts can be constructed from preferred materials that were not used with prior art thermal field emitters.

The thermal field emitter includes a heating filament in thermal contact with an emitter; filament posts in electrical contact with the heating filament to provide electrical current to heat the filament; and a base supporting the filament posts, the base having an outside length and providing an outside surface area sufficient for firmly securing the base within the electron beam system. The base includes a contact area between each filament post and the base, the contact area having a length, the contact area length being significantly less than the outside length, thereby reducing the thermal contact area between the base and the filament post and reducing heat losses of the electron source.

A thermal field emitter of the present invention can be made smaller than prior art thermal field emitters, allowing it to be used in a wider array of applications.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

In a preferred embodiment, an emitter base includes deep counterbores that surround the filament posts and open in the direction of the filament. The counterbores reduce the contact area between the filament posts and the base, thereby significantly reducing the heat flow from the filament posts to the base. With counterbores in the base, the contact area is also further away from the heating filament, which is the hottest part of the thermal field emitter, thereby, further reducing heat loss through the base. Because the heat loss through the base is reduced, less input power is required to maintain the emitter at its operating temperature, so the filament posts and filament can be made from materials, such as titanium and rhenium, that have greater electrical resistivity and lower thermal conductivity compared to the traditional material, tungsten, kovar or molybdenum.

Figure 2:
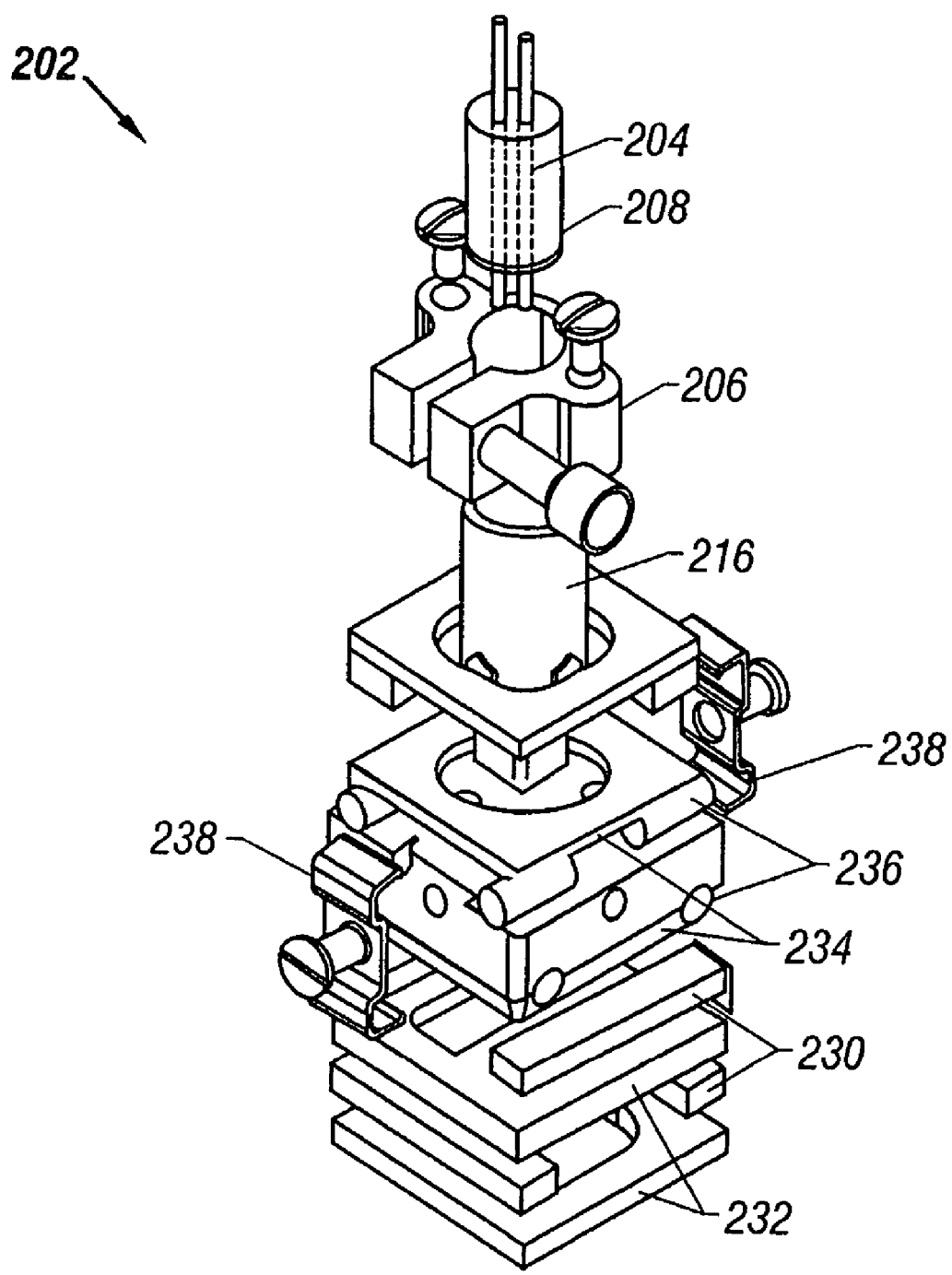
FIG. 2 shows a typical positional support used to hold and position a Schottky emitter

In electron beam applications, the electron source must be precisely aligned with respect to the optical elements in the electron column. FIG. 2 shows an exploded view of a typical positional support 202 that allows a thermal field emitter 204 to be precisely positioned in two dimensions. Some positional supports can be aligned in three dimensions. Positional support 202 uses piezoelectrical devices 230 on alumina bases 232 to move alumina slides 234 on sapphire slide rods 236. Spring clamps 238 to hold the assembly together.

Figure 1:
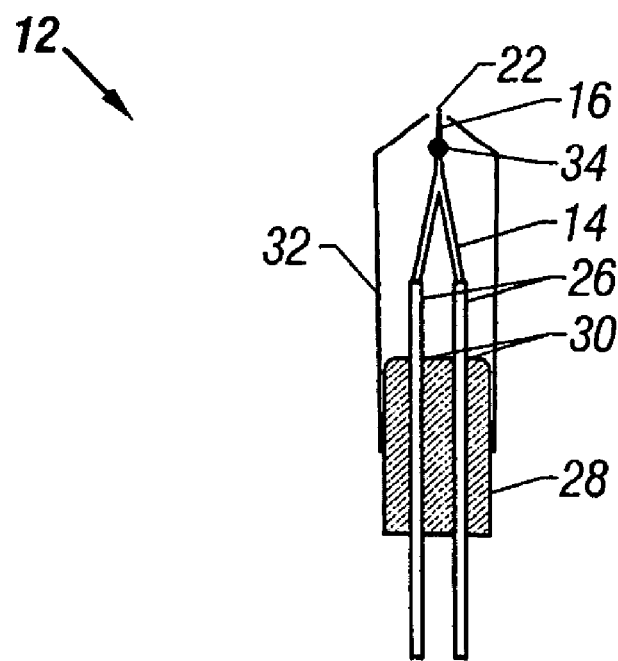
FIG. 1 is a cross-sectional view of a prior art Schottky emitter.

To be clamped securely in an emitter clamp 206 of positional support 202, an emitter base 208 needs to be long enough to allow for secure clamping. FIG. 1 shows that when a typical suppressor cap 32 is installed on a typical emitter base 28, suppressor cap 32 covers a large portion of the base. Emitter base 208 must also be long enough to provide an area for securely attaching a suppressor cap 216.

A long emitter base, however, provides a large contact area for filament posts 26, thereby providing a greater heat conduction path from the filament posts. The filament posts are thus cooled, thereby carrying heat away from the emitter and requiring additional power to maintain the emitter at operating temperature. The heat carried away from the emitter has the undesirable effect of heating other elements in the system.

Figure 3:
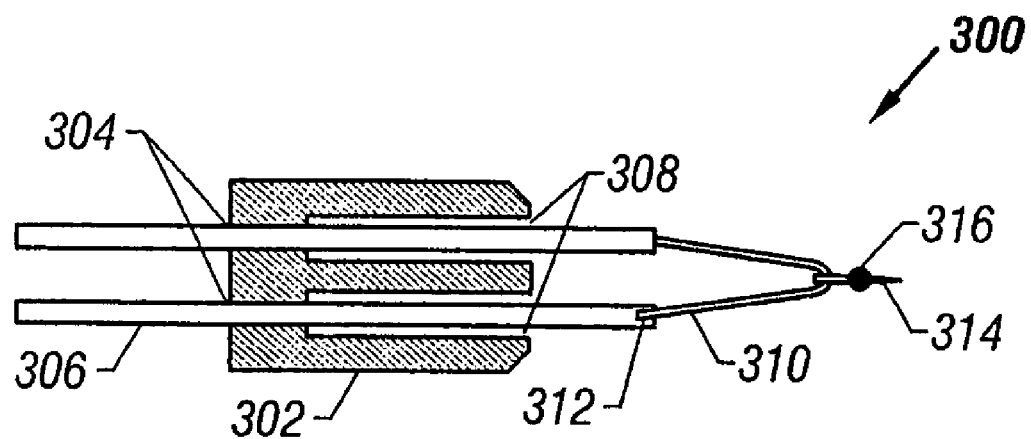
FIG. 3 is a cross-sectional view of an embodiment of a thermal field emitter of the present invention.

FIG. 3 shows a thermal field emitter 300 embodying aspects of the present invention. Thermal field emitter 300 includes a base 302, preferably comprised of a ceramic material having an alumina content greater than 95%, such as 97.5% alumina. Base 302 includes two bores 304 that accept filament posts 306. Base 302 includes two counterbores 308, each one coaxial with one of bores 304. The diameter of each counterbore 308 is somewhat larger than that of filament posts 306 to provide an insulating gap between filament posts 306 and base 302. For example, in one embodiment, filament posts 306 comprise wires having diameters of approximately 0.015 inch (0.38 mm). Counterbores 308 have a diameter of about 0.031 inch (0.78 mm). To reduce undesirable heat transfer, filament posts 306 should not touch base 302 inside counterbores 308. The diameter of counterbore 308 should be sufficiently large that the filament posts do not contact the inside walls of the counterbore, yet not so large that they compromise the strength of the base structure. A filament 310 is attached to filament posts 306 at attachment points 312, preferably by spot welding. Only one attachment point 312 is visible in FIG. 3, the other attachment point being hidden by filament posts 306. An emitter 314 is attached to filament 310 by spot welding and is typically made from a single crystal of tungsten oriented in the <100> crystal direction and coated with a coating material, such as zirconium and oxygen, to lower the work function of the emitter tip. A reservoir 316 of zirconium oxide is positioned on emitter 314 to replenish the zirconium and oxygen on the tip of 314 as the zirconium and oxygen evaporate at the high temperatures. In some embodiments, emitter 314 can extend toward base 302 past filament 310 and reservoir 316 can be positioned on a cooler part of the rearward extending portion of emitter 314 to reduce evaporation from reservoir 316. Such a design is disclosed in pending U.S. patent application Ser. No. 09/639,451 which is assigned to the assignee of the present invention.

Filament posts 306 are preferably composed of titanium, a titanium alloy, rhenium, or a rhenium alloy. Filament 310 is preferably composed of rhenium, rhenium alloy, titanium, titanium alloy, molybdenum alloy, or zirconium. These materials have higher electrical resistivity and lower thermal conductivity than tungsten or molybdenum, the material traditionally used for filament posts and filaments. Using a material having low thermal conductivity reduces the heat loss through filament posts 306 and filament 310 to the base. Higher electrical resistivity materials require less power to produce the same emitter operating temperature. With the present invention, the input power required to maintain the emitter tip at operating temperature is reduced, allowing the use of higher electrical resistivity, lower thermal conductivity materials for filament posts 306, which materials, in turn, further reduce current requirements.

The pure metals described above perform better, but cost, availability and manufacturing ease may require the use of the alloy materials described above. Preferred rhenium alloys for filament 310 include the maximum percentage of rhenium consistent with providing sufficient mechanical strength to maintain the emitter alignment. The ductility of pure rhenium is a disadvantage for its use as a filament. Alloys are stiffer and do not recrystallize upon heating. Preferred alloys for filament 310 and filament posts 306 include rhenium-tungsten alloys such as 3%, 5%, and 26% rhenium. By alloying the rhenium with tungsten, the filament is easier to shape and to spot weld, and it stays aligned better in the assembly. The power consumption of filaments made from the various alloys is similar. These alloys are also used in thermocouples and are commercially available. Similar alloys can be used for filament posts 306. Pure titanium, while useful for filament posts 306, is less useful for filament 310, which is typically heated to a high temperature in an oxygen environment during pre-operation processing of the emitter. A pure titanium filament is less suitable for heating in an oxygen environment due to the oxidation that occurs at typical operating temperature.

The positioning and geometry of the filament also affect the heat dissipation and power consumption characteristics of a thermal field emitter. Filament 310 should have as small a diameter as possible, yet still allow the emitter to be reliably attached by welding. The minimum filament diameter is typically that to which the emitter can be reliably spot welded. A preferred filament is comprised of pure rhenium or a rhenium alloy having about 26% rhenium and 72% tungsten and having a diameter of between about 0.002 inches (0.05 mm) and about 0.004 inches (0.1 mm), preferably 0.003 inches (0.075 mm).

The hottest point in a typical thermal field emitter is approximately two thirds of the way toward the apex of the filament from the attachment points. The emitter tip is typically about 200 C cooler than the hottest point. To reduce power consumption, it is typically desirable to increase the length of the filament 310, thereby moving the hottest part away from the filament post 306. The overall length of thermal field emitter 300, from the top of base 302 to the tip of emitter 314, however, is typically constrained by the space available in the electron beam system. Thus, there are typically physical restrictions on the length of filament 310. Because of the trend to miniaturization of electron beam systems, it is generally desirable to make the thermal field emitter assembly as compact as possible.

Moreover, applicants have found that after reaching an optimum length, increasing the length of the filament increases the power consumption. When using low thermal conductivity materials, such as rhenium, rhenium alloy, titanium, titanium alloy, molybdenum alloy, or zirconium, the optimum length can be achieved using a "V"-shaped filament. When tungsten is used for the filament, it is necessary to add length to the filament by bending it, for example, into a shape like a Ω to achieve an optimum length.

Figure 4:
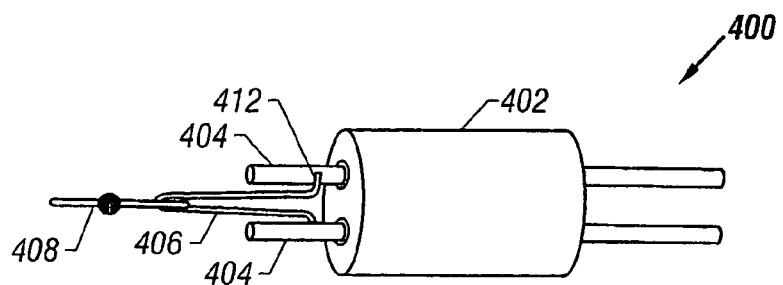
FIG. 4 is a perspective view of another embodiment of a thermal field emitter of the present invention.

One method of increasing the filament length without increasing the overall length of thermal field emitter is to move attachment points inward towards the base away from the ends of filament posts. Another method would be to shorten the filament posts. FIG. 4 shows an alternative configuration for a thermal field emitter 400, having a base 402, filament posts 404, a filament 406, and an emitter 408. Filament 406 is attached to filament posts 404 at attachment points 412 (only one visible) closer to base 402 than to ends 410 of filament posts 404. The position of attachment points 412 along filament posts 404 affects the transfer of heat within thermal field emitter 400 and the optimum positioning of attachment points 412 is determined by locating the position at which input power consumption of the thermal field emitter 400 is reduced or minimized. Moreover, by moving attachment points 412 a significant distance toward base 402, the length of filament 406 can be increased, without increasing the overall length of thermal field emitter 400, thereby reducing heat loss while maintaining a compact design.

During operation, a thermal field emitter of the present invention typically uses less power than prior art emitters. Power consumption in a preferred thermal field emitter of the present invention is approximately 1.0 watt, compared to a typical power consumption of 2.0 watts for prior art emitters. A thermal field emitter of the present invention using counterbores 308 and a tungsten filament consumed 1.8 watts. When operating in a Schottky emission mode at a temperature of greater than 1,700° C. and preferably approximately 1,800° C., power consumption of a thermal field emitter of the present invention is preferably less than 2 watts, more preferably less than 1.8 watts, even more preferably less than 1.5 watts or 1.2 watts, and most preferably less than or approximately equal to 1.0 watts. The lower input power of the thermal field emitter reduces outgassing and allows the base to be maintained at a lower operating temperature. The reduce power consumption results in part because the counterbore significantly reduces heat flow between the filament posts and the emitter base. A significant reduction in heat flow is a reduction that reduces power consumption in the emitter to less than 2 watts.

Figure 5A:
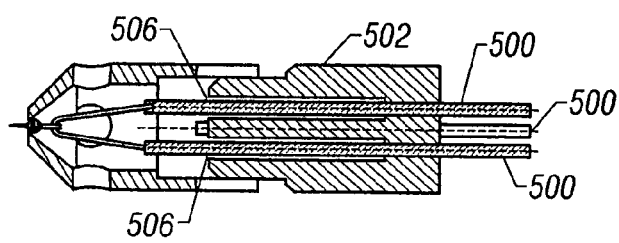
FIG. 5A shows a cross section view of a preferred embodiment of the present invention using four filament posts.
Figure 5B:
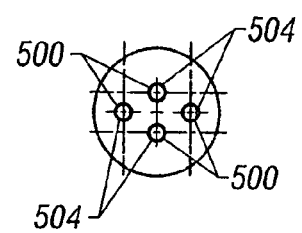
FIG. 5B shows an end view of the same embodiment.

FIG. 5A shows a cross sectional view of an embodiment in which four filament posts 500 are used, and a base 502 has four bores 504 and two or four counterbores 506. FIG. 5B shows a side view of the embodiment of FIG. 5A. The additional two filament posts 500 are used for suppressor contacts.

Figure 6:
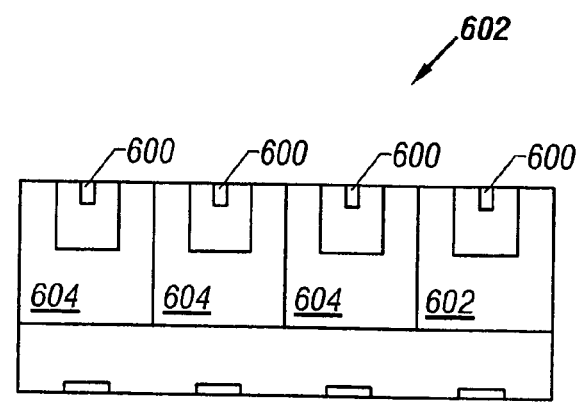
FIG. 6 is a block diagram showing an electron beam system using an array of thermal field emitters of the present invention to form multiple electron beams.

FIG. 6 is a block diagram showing multiple low power consumption thermal field emitters 600 of the present invention implemented in an electron beam system 602 using an array of electron columns 604, each column 604 having a thermal field emitter of the invention, thereby reducing the overall power consumption of the array 604 and reducing the combined heat output from the thermal field emitters 600.

Various aspects, such as the reduced contact area between the base and the filament post, the positioning of the filament away from the end of the filament posts, and the use of preferred materials for the filament or filament post can be implemented separately or in combination, depending upon the requirements of the particular application.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method for providing electrons for an electron beam instrument, the method comprising:
   providing an electron emitter for emitting electrons when heated;
   providing a heating filament in thermal contact with the electron emitter to heat the electron emitter when electrical current is passed through the heating filament, the electron emitter having extending from the filament and having a distal end converging to an emitter tip;
   providing two or more filament posts in electrical contact with the heating filament to provide electrical current to beat the filament;
   providing a base supporting the filament posts, the base having an outside length parallel to the filament posts and providing an outer surface area sufficient for firmly securing the base within the electron beam system and the base including a contact area between each filament post and the base, the contact area having a length parallel to the filament posts, the contact area length being significantly less than the outside length, thereby reducing the thermal contact area between the base and the filament post and reducing heat losses of the electron source;
   passing an electric current through the filament posts to the heating filament to heat the emitter, and
   providing an electric field at the tip of the electron emitter to cause the emitter to emit electrons.

2. The method of claim 1 in which providing a heating filament includes providing a heating filament comprising rhenium.

3. The method of claim 1 in which providing a heating filament includes providing a heating filament comprising an alloy of rhenium and tungsten.

4. The method of claim 1 in which providing a heating filament includes providing a filament comprising titanium.

5. The method of claim 1 in which passing an electric current through the filament posts to the filament to heat the emitter includes providing an input power of less than 1.8 watts to heat the emitter to a temperature greater than 1,700° C.

6. The method of claim 1 in which passing an electric current through the filament posts to the filament to heat the emitter includes providing an input power of less than 1.5 watts to heat the emitter to a temperature greater than 1,700° C.

7. The method of claim 1 in which passing an electric current through the filament posts to the filament to heat the emitter includes providing an input power of less than 1.2 watts to heat the emitter to a temperature greater than 1,700° C.

8. The method of claim 1 in which passing an electric current through the filament posts to the filament to heat the emitter includes providing at input power of approximately 1.0 watt to heat the emitter to a temperature greater than 1,700° C.

9. The method of claim 1 in which providing a heating filament in thermal contact with the electron emitter includes attaching a filament to two of the filament posts at a position away from the end of the filament posts to provide an increase in filament length sufficient to reduce power consumption without increasing the overall length of the electron source.

10. A method of making an electron source, comprising:
    providing an emitter base, the emitter base including at least two holes, each hole having a counterbore sufficiently deep to significantly reduce heat flow from the emitter post to the emitter base;
    inserting a filament post into each of the holes, each filament post fitting securely into its corresponding hole, the portion of the filament post surrounded by the counterbore not contacting the interior of the hole in the emitter base;
    attaching a heating filament to two of the filament posts; and
    attaching an emitter to the heating filament.

11. The method of claim 10 in which attaching a heating filament includes attaching a heating filament comprising rhenium, tungsten, or titanium.

12. The method of claim 10 in which attaching a heating filament includes a attaching heating filament comprising an alloy rhenium and tungsten.

13. The method of claim 10 in which attaching a heating filament to two of the filament posts includes attaching a heating filament to two of the filament posts at a position away from the end of filament posts to provide increase in heating filament length sufficient to reduce power consumption without increasing the overall length of the electron source.

14. A method of providing a thermal field emitter for use in an electron beam system, comprising:
    providing an emitter for emitting electrons when heated;
    providing a heating filament including rhenium, titanium, or alloys of either, the filament in thermal contact with the emitter to heat the emitter when electrical current is passed through the heating filament;
    providing at least two filament posts including rhenium, titanium, or alloys thereof, in electrical contact with the heating filament to provide electrical current to the filament;
    providing a base supporting the filament posts, the filament posts extending through the base in a first direction toward the heating filament to support and provide an electrical current to the heating filament and the filament posts also extending through the base in the direction away from the electron emitter to provide electrical contacts for connecting a power supply, the base having two bores, one for passing each filament post through the base, each bore having a first cross section over a first portion of the bore to contact at a contact area and provide support for the corresponding filament post and second cross section over a second portion of the bore, the second cross section providing a gap between the filament post and the base material the gap opening in the direction of the filament and increasing the distance between the filament and the contact area which the filament posts contact the base, thereby reducing heat flow between the filament post and base and reducing power consumption of the thermal field emitter.

15. A method of providing an electron source for an electron beam system, comprising:

providing an emitter for emitting electrons when heated;

providing a heating filament in thermal contact with the emitter to heat the emitter when electrical current is passed through the heating filament, the electron emitter having extending from the filament and having a distal end converging to an emitter tip;

providing multiple filament posts in electrical contact with the heating filament to provide electrical current to heat filament; and providing a base supporting the filament posts, the base providing a surface area sufficient for firmly securing the base within the electron beam system and having a top surface and a bottom surface through which the filament posts extend, the base including a contact area between each filament post and the base, the contact area having a length in a direction parallel to the filament post, the contact area length being significantly less than the distance between the top and bottom surfaces, thereby reducing the thermal contact area between the base and the filament post and reducing heat losses of the electron source.

16. The method of claim 15 in which the filament comprises rhenium, tungsten, or titanium.

17. The method of claim 15 in which the multiple filament posts comprise only two filament posts.

18. The method of claim 15 in which the electron source consumes less than 1.5 watts when operating at a temperature greater than 1,700° K.

19. The method of claim 15 in which the filament is attached to the filament post at a position sufficiently away from the end of the filament posts to provide a sufficient increase in filament length to reduce power consumption without increasing the overall length of the electron source.

20. The method of claim 15 in which the shorter contact area creates a gap around the filament post, the gap opening in the direction of the filament, thereby increasing the distance between the filament and the contact area.

21. The method of claim 15 in which the filament is attached to the posts at points between the base and the end of the post, but not at the ends of the posts.

22. A method of providing electrons for an electron beam instrument, the method comprising:

providing an electron source for an electron beam system in accordance with the steps of claim 15;

passing an electron current through the filament posts to the filament to heat the emitter; and providing an electric field at the tip of the electron electrons.

* * * * *